United States Patent
Reefman et al.

(10) Patent No.: US 8,310,024 B2
(45) Date of Patent: Nov. 13, 2012

(54) ASSEMBLY, CHIP AND METHOD OF OPERATING

(75) Inventors: Derk Reefman, Best (NL); Freddy Roozeboom, Waalre (NL); Johan H. Klootwijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 771 days.

(21) Appl. No.: 12/300,813

(22) PCT Filed: May 14, 2007

(86) PCT No.: PCT/IB2007/051821
§ 371 (c)(1),
(2), (4) Date: Nov. 14, 2008

(87) PCT Pub. No.: WO2007/132423
PCT Pub. Date: Nov. 22, 2007

(65) Prior Publication Data
US 2009/0146760 A1 Jun. 11, 2009

(30) Foreign Application Priority Data
May 15, 2006 (EP) .................................... 06113955

(51) Int. Cl.
*H01L 27/01* (2006.01)
*H01L 21/00* (2006.01)
(52) U.S. Cl. . 257/528; 257/531; 257/532; 257/E21.008; 257/E21.022
(58) Field of Classification Search ............... 257/528, 257/531, 532, E21.008, E21.022; 438/386
See application file for complete search history.

(56) References Cited

U.S. PATENT DOCUMENTS

| | | | |
|---|---|---|---|
| 6,246,121 B1 | 6/2001 | Dandia et al. | |
| 6,310,386 B1 | 10/2001 | Shenoy | |
| 6,362,012 B1 | 3/2002 | Chi et al. | |
| 6,391,707 B1 * | 5/2002 | Dirnecker et al. | 438/250 |
| 2002/0123159 A1 * | 9/2002 | Chi et al. | 438/3 |
| 2002/0142512 A1 * | 10/2002 | Ma et al. | 438/100 |
| 2004/0183512 A1 * | 9/2004 | McCune, Jr. | 323/282 |
| 2005/0040430 A1 * | 2/2005 | Ahrens et al. | 257/197 |
| 2005/0286278 A1 * | 12/2005 | Perreault et al. | 363/65 |
| 2006/0214649 A1 * | 9/2006 | Herzinger et al. | 323/282 |
| 2009/0057823 A1 * | 3/2009 | Ching et al. | 257/531 |

FOREIGN PATENT DOCUMENTS

| | | | |
|---|---|---|---|
| DE | 10012118 A | | 11/2000 |
| DE | 10358299 A1 * | | 7/2005 |
| JP | 08330517 A | | 12/1996 |
| JP | 2000260939 A | * | 9/2000 |
| JP | 2005167468 A | * | 6/2005 |
| WO | 03025976 A | | 3/2003 |
| WO | 03085729 A | | 10/2003 |
| WO | 2004055839 A | | 1/2004 |
| WO | 2004027993 A | | 4/2004 |
| WO | 2004114397 A | | 12/2004 |
| WO | 2007054858 A2 | | 5/2007 |
| WO | 2007125510 A2 | | 11/2007 |

* cited by examiner

*Primary Examiner* — Hsien Ming Lee
*Assistant Examiner* — Michele Fan

(57) ABSTRACT

The chip comprises a network of trench capacitors and an inductor, wherein the trench capacitors are coupled in parallel with a pattern of interconnects that is designed so as to limit generation of eddy current induced by the inductor in the interconnects. This allows the use of the chip as a portion of a DC-DC converter, that is integrated in an assembly of a first chip and this—second chip. The inductor of this integrated DC-DC converter may be defined elsewhere within the assembly.

24 Claims, 6 Drawing Sheets

ASSEMBLY, CHIP AND METHOD OF OPERATING

The invention relates to an assembly comprising a DC-DC converter and a method of operating said DC-DC converter.

Power consumption of today's integrated circuits (ICs) is largely dominated by dynamic and standby power consumptions. The dynamic power consumption is caused by switching events in a digital circuit or by bias currents in an analogous circuit, and is associated with the active mode of the circuit. The standby power consumption is caused by transistor leakage that occurs in the absence of any circuit switching activity, i.e. when the integrated circuit is idle, i.e. in the standby mode. Since technology scaling of ICs to higher resolution is accompanied by an increase in leakage current, the contribution of the standby power consumption to the total power consumption becomes more and more significant. To overcome this effect, various power management techniques are applied to ICs.

One of the applied power management techniques is power gating. This is implemented by insertion of power switches between power supply rails and supply pins of certain voltage islands that combine blocks requiring the same supply voltage. In the standby mode, the power switches disconnect the voltage islands from the power supply rail. This reduces leakage. The use of voltage islands, for instance a core island and a periphery island, is for instance explained for a digital IC in U.S. Pat. No. 6,246,121 that is included herein by reference. Each voltage island will receive a supply voltage from a dedicated power supply block, such as a DC-DC converter or a linear regulator However, power switches are implemented with large transistors, in view of the needed conduction of large currents. Such large current are drawn from the power supply rail especially at a low voltage drop. As any transistor, they have a leakage in the standby mode, because a path exists between the power supply and ground. Due to their size, the power consumption through the leakage of these power switches can still be considerable.

It is therefore an object of the present invention to provide an improved power supply system through which the power consumption is reduced.

This object is achieved in an assembly of a first chip and a second chip, which first chip comprises a semiconductor device, and which second chip comprises a substrate with a surface and at least one trench capacitor comprising a first and a second electrode and an intermediate dielectric that extends substantially perpendicular to the surface of the substrate within a first area. In this assembly a DC-DC converter is defined with a switching frequency in the range of 50-200 MHz, which converter comprises an inductor and further comprising a network of the trench capacitors in the second chip. The trench capacitors are coupled in parallel with a pattern of interconnects that is designed so as to limit generation of eddy current induced by the inductor in the interconnects.

According to the invention, power consumption is reduced by introduction a DC-DC converter with an inductive topology into the assembly. This localized and integrated DC-DC converter has the function of up-conversion or down-conversion of the supply voltage to an application voltage. Power consumption is therein reduced due to several factors. First of all, the application voltage may be specific for the operation of the first chip, and more specific than in case of a separately assembled DC-DC converter. The application voltage may also be regulated. Such better specified application voltage is usually lower, resulting in lower power consumption. Secondly, currents are reduced due to the use of the localized DC-DC converter, which also results in lower power consumption. Additionally, the DC-DC converter forms an adequate isolation in the standby mode.

In order to enable integration of the DC-DC converter into the assembly, it needs to have a high switching frequency. This high frequency is higher than the maximum frequency achievable with conventional DC-DC converters. The switching frequency of conventional DC-DC converters is limited by parasitic components to the buffer capacitor within the DC-DC converter. The maximum frequency tends to be in the range of 5-10 MHz.

The switching frequency may be increased according to the invention, since the individual trench capacitors have very low parasitic components. The interconnected network of trench capacitors may also be designed to have very low parasitic components. But due to the integration, the various components tend to influence each other, which causes parasitics. It turns out that especially the inductor can create parasitics in the network of trench capacitors by generation of eddy currents. Thereto, the pattern of interconnects of trench capacitors is designed so as to withstand the generation of eddy currents therein.

This also sets the range of switching frequencies that is available for the present integrated inductive DC-DC converter. Eddy currents and other parasitic elements will be too high above the upper limit of 200 MHz. The lower limit is given by size requirements for the passive components. And if the size of integrated components gets too large, interconnects get bigger, leading to the creation of less straight and direct interconnects, and hence to larger parasitics.

In an advantageous embodiment, the network of trench capacitors is positioned such with respect to the inductor that the trench capacitors are located within an outer edge of the inductor on perpendicular projection of the trench capacitors and the inductor on the surface of the substrate. This embodiment simplifies design so as to reduce eddy currents and parasitics to a minimum.

As stated before, the design of the interconnects between the capacitors and also between capacitors and inductor should limit the generation of eddy currents. Additionally, the parasitic impedance should be low. A first design feature may be the provision of substantially block-shaped interconnects. One such interconnect may cover, in perpendicular projection, several trench capacitors. It thus not merely extends between a first and a second trench capacitor. It is the interconnect to which several trench capacitors are connected, and as seen in top view, under which several capacitors are hidden. This shape reduces the inherent impedance.

A second design feature is that the block-shaped interconnects are stripe-shaped. Even though parallel block-shaped interconnects are used for interconnecting trench capacitors in parallel, the stripe-shaped is preferred above one rather square interconnect in order to limit eddy currents generated by the inductor.

A third design feature is that the pattern of stripe shaped interconnects is designed so as that the stripe shaped interconnects extend radially from a center. This center is chosen in accordance with the design of the inductor; suitably it is the center of the inductor. In an advantageous modification, the center is effectively the center of the pattern of interconnects. The interconnects are then suitably connected to each other in this center. Alternatively, the center is outside or at the edge of the pattern of interconnects. As seen from the center, the pattern of interconnects extends within an angle of for instance 20-90 degrees. This implementation is particularly preferred in case the inductor is encompasses a larger surface area that the network of trench capacitors.

A stripe-shaped interconnect can be stated to have a length along the radial axis defined from the center of the pattern of interconnects and a width perpendicular to the length. In a preferred modification, the width of the interconnect increases with increasing distance to the said center. Preferably, a distance between a first and a second neighboring stripe-shaped interconnects is equal over substantially the complete length of the interconnects. This modification maximizes the surface area that may be used for the definition of trench capacitors.

Additionally, it turns out that the distribution of the trench capacitors is preferably not homogeneous. Suitably, the trench capacitors are concentrated in an area that is remote from the center, e.g. near to the inductor. Thus, the trench capacitors are then defined within a first and a second concentric capacitor area, of which the first area is located inside the second area. Herein the density of capacitors is larger in the second capacitor area than in the first capacitor area.

Trench capacitors may be defined in the substrate of the second chip or on the substrate. Preferably, these are defined in the substrate, which allows deeper trenches and thus larger capacitance densities. The trench capacitor as referred to in the present invention may alternatively be in the shape of pillars, such as described in the non-prepublished application EP 06300422.0 (PH 005852) that is included herein by reference. The network of trench capacitors that is coupled in parallel usually has a connection through the top or second electrodes of the trench capacitors. These top electrodes extend also on the substrate. Particularly when using pillars, there may be a further connection through the bottom or first electrodes, up to the level where it is difficult to determine whether it relates to a capacitor structure comprising trenches and/or channels or a plurality of capacitors in trenches that are coupled in parallel. The term 'network of trench capacitors' is intended to cover all these embodiments.

The pattern of interconnects may be defined in one or more electrically conducting layers. It is advantageous to deposit the second electrodes of the trench capacitors as a layer of doped polysilicon. This layer will fill up the trenches and it has a coefficient of thermal expansion equal to that of the substrate. Therewith reliability problems due to thermal cycling are prevented. Nevertheless, the electrical conductivity of polysilicon is less than that of other metals and alloys conventionally used in metallization structures of integrated circuits, such as aluminum, nickel, copper and aluminum alloys. It appears advantageous to provide such a metallization as part of the interconnects in addition to the polysilicon electrodes and interconnects. This metallization reduces the impedance of the interconnects between the trench capacitors, and it further reduces the impedance of the interconnect between trench capacitor and inductor.

The inductor may be defined in the present assembly on different locations. In a first embodiment, the inductor is defined in the second chip. Suitably, it is defined in the same metallization as mentioned above for the pattern of interconnects of the trench capacitors. This embodiment has the advantage that the connections between capacitor and inductor are defined properly, so that the parasitic impedance and resistance is small. A disadvantage may be that the width and size of the inductor may be substantial in order to fulfill the requirements of the application.

In a second embodiment, the assembly comprises an encapsulation wherein the inductor is defined as a metal pattern that is coupled to the second chip with bumps. Such an inductor is known from WO-A 2003/85729. The metal pattern can thus be provided in any desired thickness and against reasonable costs. However, there is most probably a need for an additional assembly step that needs to be compatible with other assembly steps.

In a third embodiment, the assembly comprises a multilayer carrier substrate to which the first and the second chip are assembled, in which carrier substrate the inductor is defined. This multilayer carrier substrate is for instance a tape or laminate of the type in use for ball grid array packages. Definition of an inductor herein is for instance disclosed in U.S. Pat. No. 6,310,386, but for another purpose.

Suitably, the inductor is characterized with a parasitic resistance over inductance ratio, $R_{par}/L$. This ratio determines the efficiency of the inductor. The maximum allowable ratio tends to depend on the semiconductor device, and particularly the quality of any transistors or diodes that are part of the DC-DC converter. Suitably, the ratio is less than 0.05 $\Omega/nH$. Advantageously, the ratio is 0.02 $\Omega/nH$ or less. This latter value is still achievable when the inductor is integrated in the second chip.

Advantageously, the switching frequency of the DC-DC converter is above 80 MHz and below 150 MHz. Good results have been obtained with a switching frequency of 90-110 MHz. The parasitics as expressed in the equivalent series inductance of the network of trench capacitors, is then preferably less than 40 pH, more preferably even less than 30 pH. This is also achievable with the technology of trench capacitors, particularly if the overall capacitance is 20 nF or more.

Several topologies of an inductive DC-DC converter are known in the art, such as buck converters, buck-boost converters and cuk converters. These are therewith particularly suitable for larger output currents, upwards from 5 mA. All such inductive topologies have a filter to obtain essentially direct current at its input and output terminals.

In a preferred embodiment of the invention, the DC-DC converter comprises an output filter that is defined as a series notch circuit. The inductor and the capacitor of the series notch circuit are designed such as to create a notch at the switching frequency of the DC-DC converter. Such a series notch circuit is attractive, as it tends to have a small voltage ripple. This small voltage ripple allows reduction of the inductor size, since not the inductor itself, but the voltage ripple is a specification to DC-DC converter.

The use of a series notch circuit as part of a DC-DC converter requires accurate matching of these inductor and capacitor, or alternatively, adjustment of the switching frequency to the value of the notch in the series notch circuit. The prior art needed adjustment of the switching frequency, which is not desired. This adjustment was needed due to variations in the values of discrete capacitors and inductors of about 15%. In the present invention, the notch can be designed adequately, and no adjustments of the switching frequency are needed. This is achieved due to manufacture with an accuracy of more than 95% and even 98% or more.

In a further extension hereof, the output filter comprises a cascade of notch filters, which is tuned both to the switching frequency and its second harmonic. Appropriate matching of the inductor and the capacitor is then mandatory, as the harmonic is always an integer multiple of the fundamental switching frequency. By integrating the inductor and the capacitor into the second chip, a matching of both is achieved with a tolerance of less than 1%, in most cases even in the order of 0.1%.

In another or additional extension, the output filter comprises a cascade of one or more notch filters and a low-pass filter. Such a cascade appears to have superior performance.

The active components are suitably integrated in the first chip. However, alternatively, they may be defined in the second chip. In the latter case, it is preferable that the substrate is defined into a high-ohmic area and a low-ohmic area. The active elements are then defined in the low-ohmic area. The trench capacitors and the overlying inductor are defined in and respectively on the high-ohmic area. High-ohmic is understood herein to have a resistivity of more than 0.5 kOhm/square. Such high-ohmic substrate is advantageous for the performance of the inductor and also to allow low-cost manufacture of trench capacitors. Herein, a surface zone of the semiconductor substrate in the trench is used as the first electrode.

In order to make the assembly as small as possible, it is suitable that the first chip overlies the inductor at least partially. Then, it is preferred to apply a shielding between the inductor and active elements within the first chip. The shielding may be defined in the first chip, in the second chip, or in a separate metal layer in the encapsulation. In case it is present in the second chip, one suitable possibility constitutes the use of the second surface of the substrate. This second surface is then not only shielding surface, but also the surface to which the first chip will be assembled. Most suitably, use is made of a shield as disclosed in WO-A 2004/055839, which is included herein by reference. Such a shield is defined in relation to the inductor, which is situated in an inductor plane. The inductor is designed to be substantially symmetrical with respect to a mirror plane perpendicular to the inductor plane. The shield is defined in a ground shield plane that is oriented in parallel to the inductor plane. The shield comprises a plurality of electrically conductive tracks that have an orientation perpendicular to the mirror plane. The advantage of this shield is that loop currents are prevented and that a reduction in the effective self-inductance is therewith prevented.

In an advantageous embodiment, the localized DC-DC converter is used in an assembly that operates on the basis of a first and a second supply voltage. Such first and second supply voltage may be used within the first chip. Alternatively, these are used with a first chip and a third chip, both of which comprise semiconductor or semiconductor alike devices, but need different supply voltages. Due to the integration of the DC-DC converter, the assembly can be provided with a single supply voltage as input. This means that the interface of assembly to an external board may be reduced to a single pin or a plurality of coupled pins. This is evidently advantageous for simplifying design. It furthermore allows supply of a packaged assembly that may be used as any standard device without any further modification of a printed circuit board. This embodiment could be applied as well with a DC-DC converter in a switched capacitor topology.

In a most advantageous modification of this embodiment, the first chip and the third chip comprise different types of semiconductor (alike) devices. The first chip is for instance a driver IC, while the third chip is a light emitting diode, a sensor, a MEMS-component. In case of a driver IC, this suitably is designed to drive the third chip.

In a further advantageous modification, the assembly comprises more than one DC-DC converter so as to provide different voltage islands in the assembly with different supply voltages. This modification is for instance desired, if the needed voltages are rather different. Then the design of a single DC-DC converter would not fit for both voltage islands. This modification may also be desired in case that a proper isolation is needed between the voltage islands. This may even be the case if the assembly does not have a third chip. For instance, with an IC as a first chip, different voltage islands may be present for mostly digital core functionality and for mostly mixed-signal peripheral functionality. It is not needed herein, that both DC-DC converters are of the same type, e.g. one DC-DC converter may be an inductive one, allowing larger output current, while a second DC-DC converter is a switched capacitor type, which can be miniaturized further.

In an even further modification, the integrated DC-DC converter is made reconfigurable. In this manner, one DC-DC converter can be used for up-conversion and for down-conversion. Additionally, the ratio between the input voltage and the output voltage may be tuned. While a conventional ratio is in the range of 0.5-2, or 0.25-4, larger ratios are achievable due to the integration. A larger ratio is for instance 0.1-10, or 2-10. The larger ratios are achievable, as a larger number of capacitors is needed. The ESL requirement is increasingly more difficult to achieve with discrete capacitors, but can be achieved with the integrated network of trench capacitors. A particularly preferred version of reconfigurability makes use of trench capacitors with a second dielectric and a third electrode, wherein at least one of the electrodes and particularly the intermediate one is switchable. The switching allows to tune the capacitance density of the capacitor. This concept is described in the non-prepublished application EP05 110488.3 (PH001923), which is herein included by reference.

The invention further relates to the embodiment of the second chip with the network of trench capacitors that is provided with a pattern of interconnects that is designed so as to limit eddy currents therein. Such eddy currents would have been generated therein otherwise by a nearby inductor that is part of the DC-DC converter of which the network of trench capacitors is also part.

The design of the present chip is very suitable and needed in view of the requirements of the DC-DC converter with a switching frequency of 50-200 MHz. However, the design may be used advantageously also for filters for other specific functions that are to be integrated.

All other design features mentioned above or in the following description may be used advantageously in this second chip:

stacked capacitors with a second dielectric and a third electrode may be applied to increase the capacitance density without an increase in ESL. The shape of the capacitors may further be optimized.

vias through the substrate—generally a semiconductor substrate—may be applied to have a proper grounding. Isolated vias for signal transmission may be defined additionally.

the substrate resistivity may be increased in a first area in which the trench capacitors are designed to values of 0.5 kOhm or even more. This is particularly desired in case that the first, bottom electrode of the trench capacitor is defined as a surface zone in the semiconductor substrate.

the inductor is suitably integrated in the chip. This allows an adequate design, such as to minimize spread in the elements as a consequence of tolerances in the production and assembly process.

the pattern of interconnects is defined, at least also, in a metallization, so as to reduce the internal resistance herein the pattern of interconnects comprises block-shaped interconnects, suitably stripe-shaped, which are preferably applied radially from a center that is overlapping with a center of the inductor.

bond pads are suitably defined for flip-chip assembly with a further chip

The invention also relates to the use of the assembly wherein the DC-DC converter is switched with a switching frequency in the range of 50-200 MHz. Herein, the active elements are driven to switch with the switching frequencies. The driving occurs through a control IC. It is appropriate that the DC-DC converter is coupled to such control IC with a bumped connection. Such bumped connection has a low ESL, which is generally not the case with a wirebonded connection.

These and other aspects of the assembly, the chip and the method according to the invention will be further elucidated with reference to the Figures that are purely diagrammatical and not drawn to scale, and wherein equal reference numerals in different Figures refer to the same or like elements, in which Figures.

Figure 1:
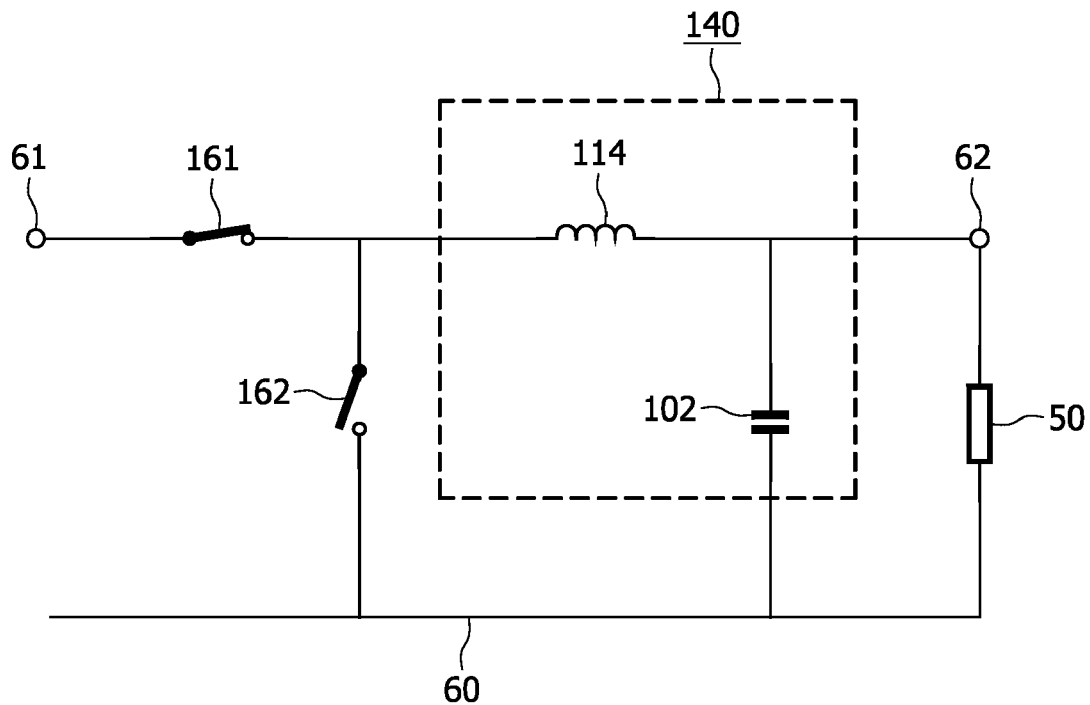
FIG. 1 shows a diagram of an inductive converter.

FIG. 1 shows a block diagram of an inductive converter as known to the skilled person. The converter comprises an input 61 having an input voltage $V_{in}$ and an output 62 having an output voltage $V_{out}$. The ratio between input and output voltage $V_{in}/V_{out}$ depends on the application and the implementation. The output 62 of the converter gives access to the load 50. This returns to an output line 60, which is generally the grounding. The DC-DC converter comprises a plurality of switches 161, 162 and an output filter 140. The output filter comprises an inductor 114 and a capacitor 102 in a low-pass filter topology that is known per se. The operation of the converter is based thereon, that the capacitor 102 can be loaded by switching the converter into a first state at the input voltage. Afterwards, the load may use the current of the capacitor 102 and the input voltage to operate at the output voltage $V_{out}$. Then the converter is switched into a second state. The switching frequency of the converter is the frequency at which the switches 161, 162 are switched. This switching frequency also defines the frequency of current reversal and loading and deloading of the capacitor 102. The shown topology is rather simple, as will be understood by the skilled person. More switches in more complicated circuits may be applied in practice to improve switching behavior.

A measure to define the parasitic effects of the DC-DC converter is the ripple voltage $V_{ripple}$. This expresses variations around the desired output voltage $V_{out}$. The larger the variations, the higher the risk that a load gets a voltage that is above its breakdown voltage, or that is so low or high to effect unexpected and undesired loading or switching effects. Therefore, a DC-DC converter is specified to have a certain ripple voltage $V_{ripple}$. At frequency ranges where the ripple voltage $V_{ripple}$ is higher than the specified value, the DC-DC converter cannot be used.

Conventional DC-DC converters usually have a maximum switching frequency of 5 or 10 MHz. Such conventional converters usually have a switched capacitor topology or an inductive topology. Both of them rely on a capacitor that acts as a buffer capacitor. In practice, every capacitor is characterized by some non-zero equivalent series inductance—also referred hereinafter to as ESL. This ESL is a measure for available parasitic components. At a certain frequency, this ESL is so large that the capacitor fails to act as a buffer capacitor. The certain frequency is about 80% of the self-resonance frequency.

In order to achieve a higher switching frequency, the ESL, and to a lesser extent the equivalent series resistance ESR, need to be reduced. According to the invention, this is achieved by using trench capacitors that are mutually connected according to a specific pattern of interconnects. This pattern is designed so as to limit eddy currents. While trench capacitors have themselves a low ESL, the ESL would increase tremendously due to the generation of the eddy currents.

Figure 2:
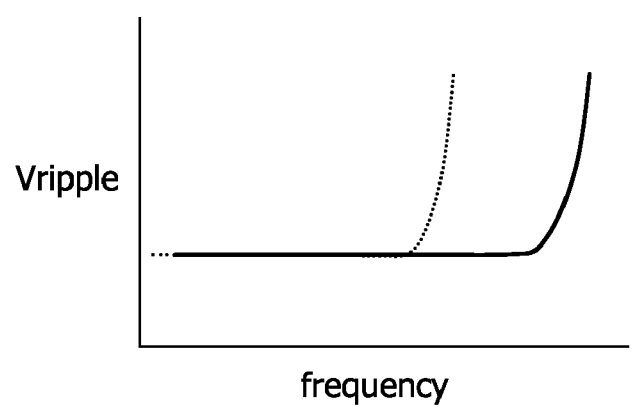
FIG. 2 shows a graph in which the ripple on the output voltage ($V_{ripple}$) is shown as a function of the switching frequency of the DC-DC converter for the prior art and for the invention.

FIG. 2 shows a graph in which the ripple voltage $V_{ripple}$ is shown as a function of the switching frequency f. The graph shows the value for a prior art inductive converter as a dotted line, and for an inductive converter according to the invention as a continuous line. The graph shows clearly that the maximum frequency in the converter of the invention is higher than the maximum frequency of the prior art converter. It is understood by the inventors, without being bound to it, that the increase in ripple at a certain frequency in the converter of the invention, is due to the increase of eddy currents in the pattern of interconnects. Such currents not only get stronger with an increase in frequency, but also the surface area needed for the generation of eddy currents decreases with a frequency increase.

Figure 3:
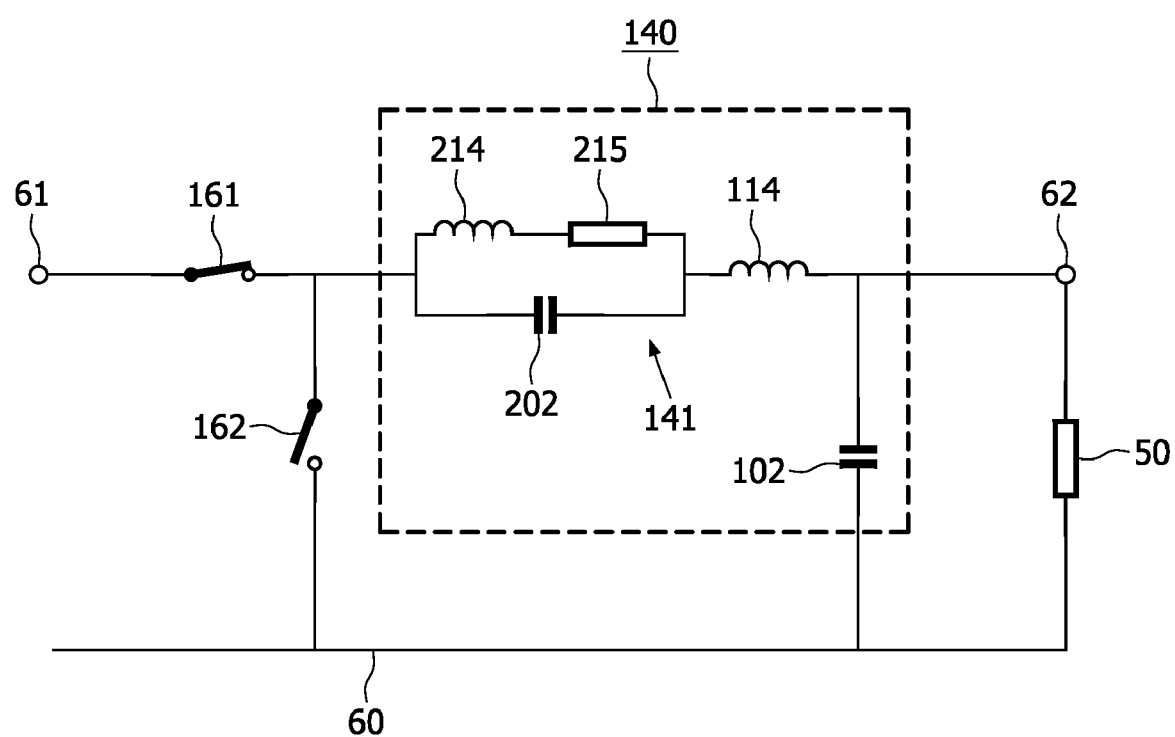
FIG. 3 shows a diagram of an inductive converter with a series notch output filter.

FIG. 3 shows a block diagram of a second inductive DC-DC converter. The output filter 140 comprises herein a series notch filter 141 in addition to a low pass filter. The series notch filter 141 comprises a capacitor 202 that is connected in parallel with an inductor 214 and a parasitic resistance 215. The notch filter 141 is designed so that a notch occurs at the chosen switching frequency. This is achieved by appropriate filter design. The provision of the series notch filter 141 is advantageous, as it allows reduction of the inductance without an increase in the ripple voltage. It moreover has turned out that the inductance may be summed of the available inductors 214, 114. This furthermore has the advantage that a single inductor with a relatively large size may be replaced by several inductors, each with a smaller size. Suitably, all capacitors in the output filter are trench capacitors, so as to limit the ESL. This is particularly true of the series notch filter, which operates at the fundamental of the switching frequency, while the further filter operates at a harmonic of the switching frequency. In view of the double frequency of the harmonic, the size of the further filter is smaller as well.

Figure 4:
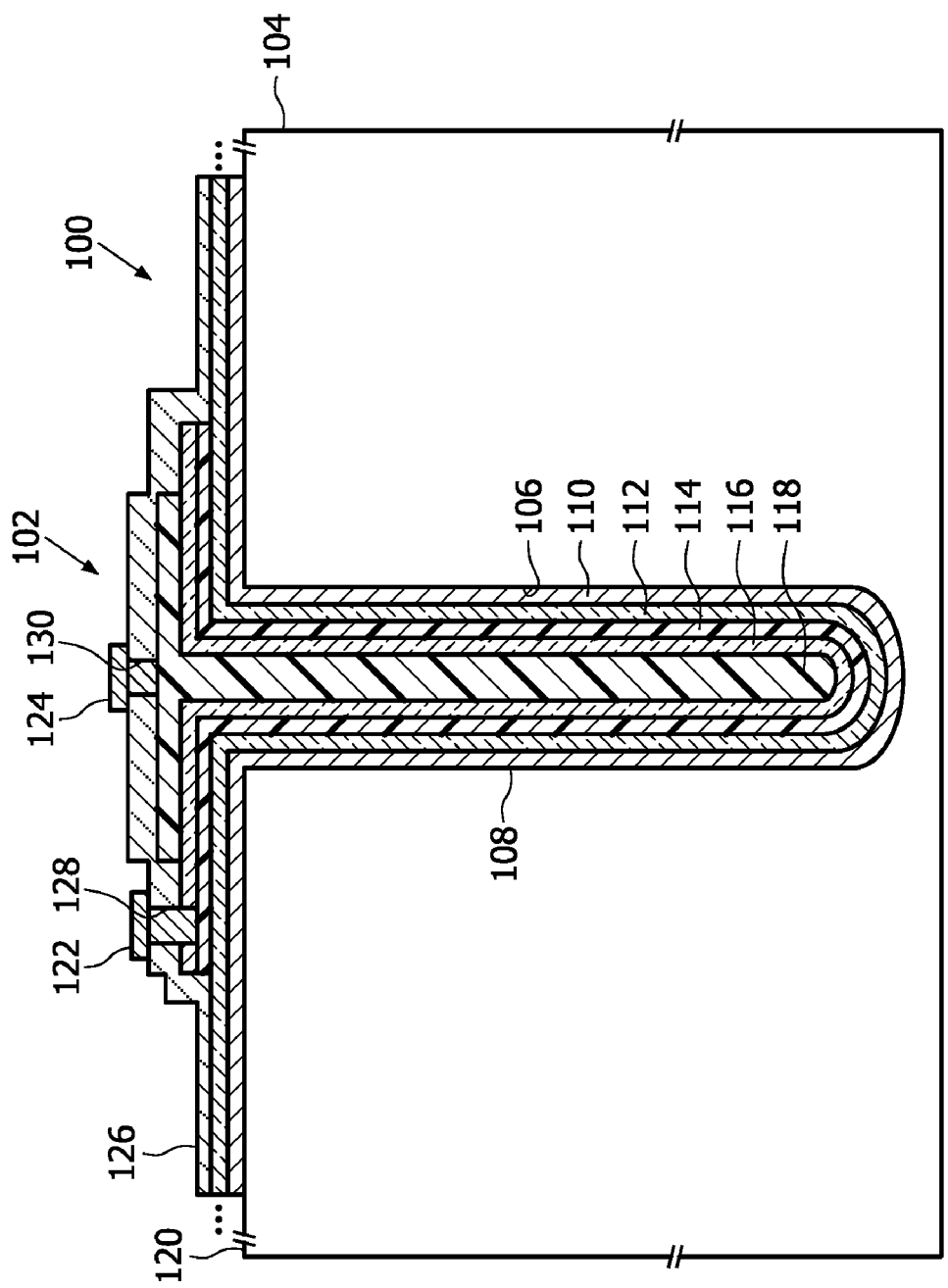
FIG. 4 shows in cross-sectional view a trench capacitors.

FIG. 4 shows a schematic cross-sectional view of a portion of the second chip 100. This chip 100 comprises a MIMIM capacitor 102 in a substrate 104 of a semiconductor material. In this example, the semiconductor material is silicon and it has a high resistivity of more than 0.5 kOhm per square. This Figure is simplified in that only a single trench capacitor is shown. In particular, further details of metal layers for wiring are omitted. The present example shows a capacitor with first, second and third electrode 110, 114, 118. The capacitor 102 further has a first dielectric 112, and a second dielectric 116, each present between two of the electrodes.

Trench capacitor 102 is formed in a pore 106 in substrate 104 with a first surface 101 and an opposite second surface 103. The pore typically has a diameter of about 1.5 μm and a depth of between 10 and 30 μm. The depth of 30 μm is reached when using a dry-etching technique for producing the pore before depositing a pore filling. When using a wet-etching technique, depths of at least 200 μm can be obtained. As can be seen in the Figure, the dielectric 112 extends substantially perpendicular to the surface 101 of the substrate 104 within a first area (e.g. the pore 108).

A pore filling of pore 106 is formed by an alternating layer sequence 108 comprising a highly n-doped ($n^{++}$) layer 110, a first dielectric layer 112, a conductive poly-silicon layer 114, a second dielectric layer 116, and a second conductive poly-silicon layer 118, the latter filling the center of the pore. The first dielectric layer 112 is a nominally 30 nm thick dielectric layer stack consisting of a thermal oxide, a silicon nitride layer grown by low pressure chemical vapor deposition (LPCVD), and a second oxide layer of 5 nm thickness deposited by LPCVD using tetraethylorthosilicate (TEOS). Polysilicon layer 114 preferably is an n-type in-situ doped polysilicon layer deposited by LPCVD from $SiH_4$ and diluted $PH_3$.

This sequence of an ONO layer stack and a poly-Si is repeated by layers 116 and 118 with the exception, that both oxide cladding layers in the second dielectric layer 116 are TEOS layers deposited by LPCVD.

The overall shape of the original pore 106 and the individual layers of the alternating layer sequence 108 resemble an upright "U". The U-shape is preferred because of the breakdown voltage that can be achieved by avoiding sharp edges in the electrodes. It is therefore preferred to have very smooth surfaces of the electrodes 110, 114, and 118. With the chosen design of the layer structure 108 it is possible to achieve high breakdown voltages. Electronic device 100 is therefore configured to handle voltages in the range of tens of volts.

As is obvious from the described layer structure, the dielectric layers 112 and 116 provide an electrical isolation between the conductive layers 110, 114, and 118, which are also refer to as electrode layers herein.

Substrate 104 typically contains an array of filled pores, which resemble pore 106 and the pore filling 108 provided by the layer sequence of layers 110 through 118. The pitch between adjacent pores preferably is in the range of 1.5-3 µm.

On the top side 120 of substrate 104, the layer sequence is continued as a horizontal layer stack parallel to the surface of top side 120 to provide a contact structure for the electrodes. In the present example, only the poly-silicon layers 114 and 118 are provided with contacts 122 and 124, respectively. An interlevel dielectric layer 126 provides electric insulation. Contacts 122 and 124 are made by, e.g., electrode-gun evaporative deposition of an aluminum layer of 1 µm thickness, and wet-etching after photolithographic steps.

After a furnace annealing step of 30 minutes at 1000° C., the conductivity of poly-silicon layers 114 and 118 is 1 mΩ*cm. Of course, this annealing step must be performed subsequently after the poly-Si deposition, at least before metal deposition.

Trench capacitor 102 of FIG. 4 therefore forms a MIMIM capacitor structure with a floating substrate electrode that is formed by $n^{++}$-electrode layer 110.

Instead of the stack of oxide, nitride and oxide, other materials or combinations thereof may be applied as the dielectric material. Such a material can be any single layer of oxide, nitride or the like; any material with a higher dielectric constant, such as tantalum oxide or hafnium oxide, or the like. These layers can be suitably applied with (low pressure) chemical vapor deposition. With this technique, the complete surface as far as uncovered with a mask, is provided with the desired material. An alternative is the use of wet-chemical deposition techniques, including sol-gel processing. It is preferred to apply an oxide layer, such as a thermal oxide, onto the substrate, in order to improve the adhesion. Another alternative is the use of a single nitride layer of about 15 nm—instead of the stack with 30 nm thickness. This increases the capacitance density from 30 to 90 $nF/mm^2$, but reduces the breakdown voltage from 25 to 7 V.

Figure 5:
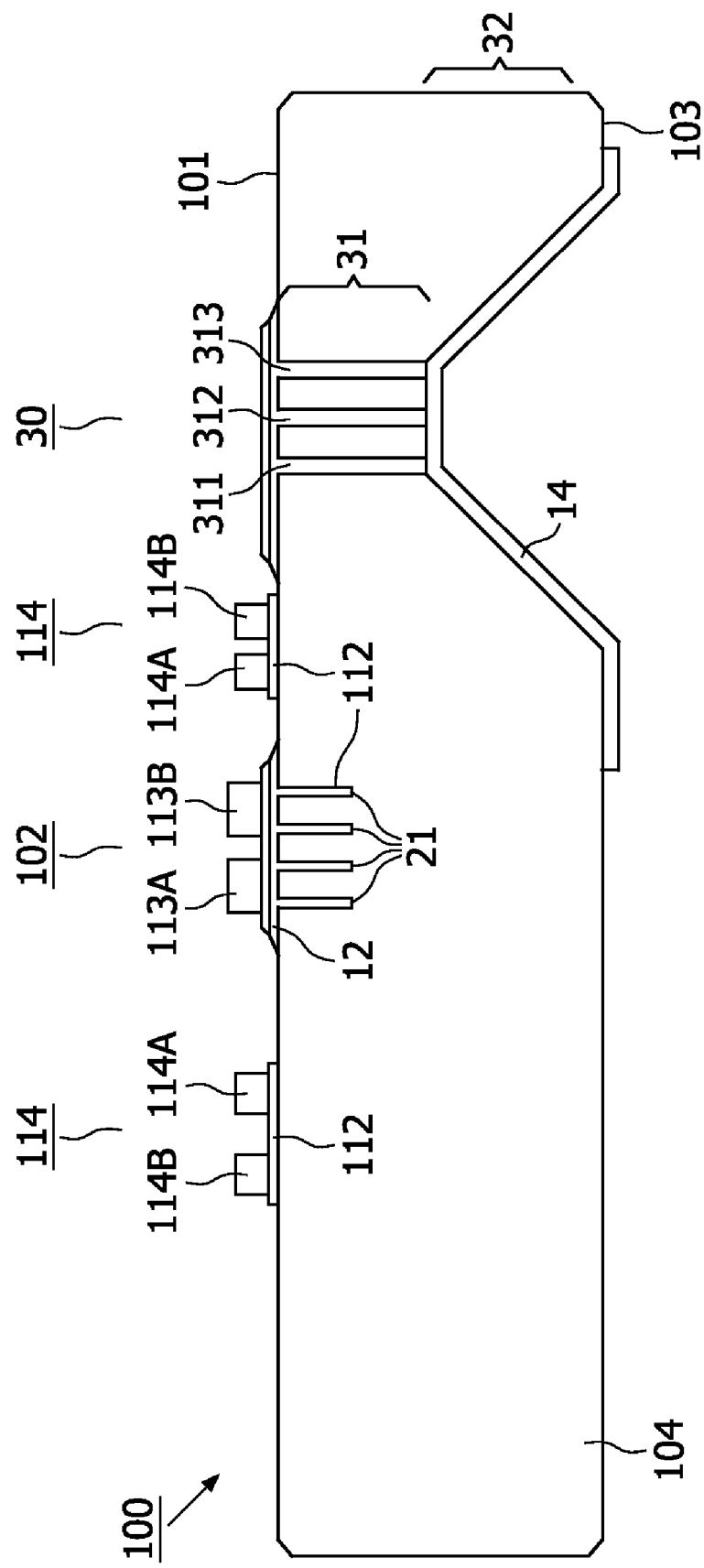
FIG. 5 shows in cross-sectional view the chip.

FIG. 5 shows an embodiment of the chip 100, that is provided with a vertical interconnect extending from the first surface 101 to the second surface 103. This embodiment comprises a network of the trench capacitors 102, which are exposed at the first surface 101. This embodiment further shows a vertical interconnect 30. Both the vertical interconnect 30 and the network of capacitors 102 have in this embodiment a plurality of trenches, 21, 311, 312, 313. Although not shown, it is suitable that the network of trench capacitors 102 comprises many individual trenches 21, that may be defined on mutually differing distances.

The vertical interconnect 30 comprises a first part 31 and a second part 32 of wider dimensions. As will become clear from the further discussion, the first part 31 is made by anisotropic etching from the first surface 101, and the second part 32 is made by etching from the second surface 103, and particulary wet-chemical etching. The chip 100 comprises in at its surfaces at the first and second surface 101, 103 as well as in the trenches 21, 31, 32 a couple of layers. Not shown here are first conductive surfaces that constitute the bottom electrode of the vertical trench capacitor 102. Shown is a layer 112 of dielectric material, that is present at nearly the complete surface. On top of the layer 112 of dielectric material, a layer of electrically conductive material is present. This layer—not shown—fills the trench. This layer is for instance polysilicon, but may alternatively be another material such as copper, sol-gel deposited silver, aluminum. At the first surface 101 the trench capacitor 102 and the vertical interconnect 30 are provided with a further metallization of AlCu in this case. The layers 112 and 13 can be used as interconnect layers, and may be mutually separated at certain positions by an insulating layer. The second part 32 of the interconnect has its surface covered with a layer 14, in this case of electroplated copper. The copper extends at the second surface 103 of the substrate 104 and forms the wiring pattern. The layer 14 may fill the second part of the interconnect 30.

According to the invention, the chip 100 is further provided with an inductor 114. The inductor 114 comprises a first winding 114A and a second winding 114B. The inductor 114 is suitably defined on an isolating layer, which is in this example the layer 112 of dielectric material, that is also used within the trench capacitor.

An inductor generates eddy currents in nearby electrical tracks. In order to limit the eddy currents in the trench capacitor network 102, the network 102 is provided with an optimized pattern of interconnects 113A, 113B. The pattern will be shown in more detail with respect to FIGS. 6 and 7.

Figure 6:
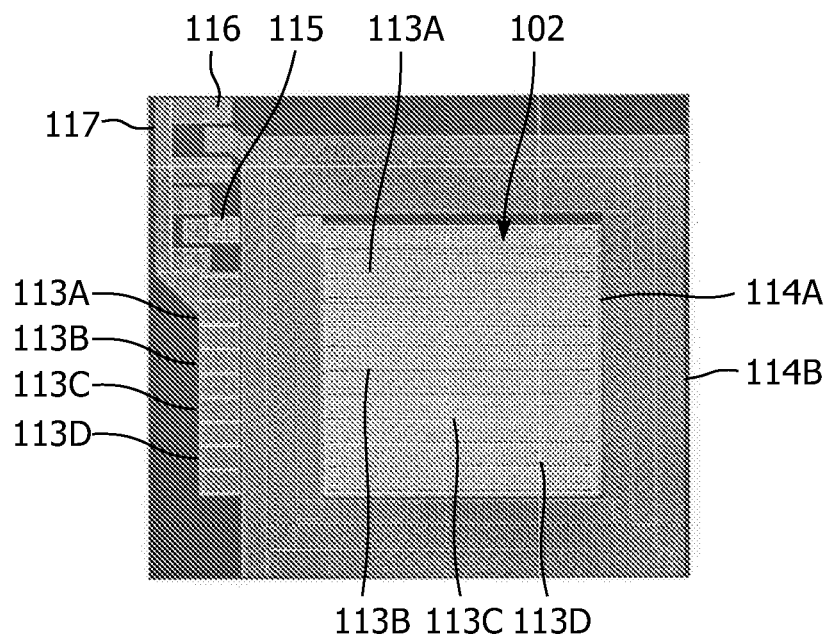
FIG. 6 shows a top view of a first embodiment of the chip.

FIG. 6 shows in a top view the combination of inductor 114 and pattern of interconnects 113. As shown herein, the pattern of interconnects 113 comprises a plurality of interconnects 113A-13D extending in parallel, which each of those has a limited width. Each of the interconnects is thus essentially stripe-shaped. The network of trench capacitors 102 is defined below the interconnects 113. The interconnects 113A-13D cross the inductor in a second conductive layer, in case of integration of the inductor 114 and the interconnects 113A-113D in a single metallization layer in the second chip 100. The layer of polysilicon is suitable for such crossing. The same is true for the input 115 of the inductor 114. The output 116 of the inductor is also shown in this FIG. 6, as well as an interconnect line 117. This interconnect line couples the interconnects 113A-13D and forms the input of the trench capacitor network 102. The output of the trench capacitor network 102 is not shown herein; it is lead to ground directly. While the layer of polysilicon may extend over the complete surface, it is suitably pattern in accordance with the pattern of interconnects 113.

Figure 7:
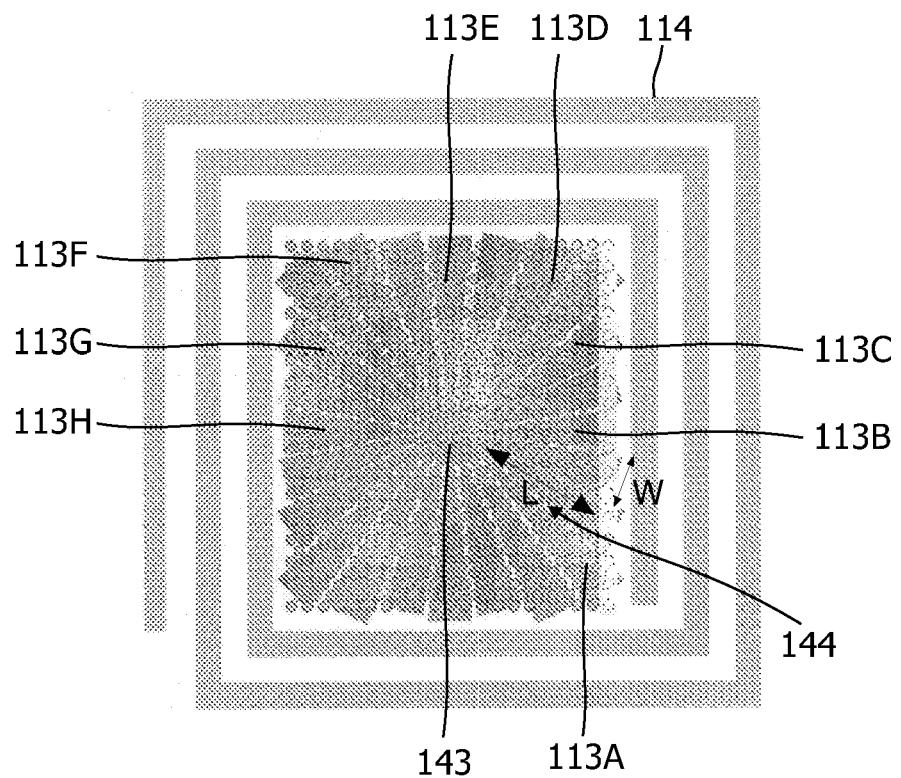
FIG. 7 shows a top view of a second embodiment of the chip.

FIG. 7 shows in a top view a second embodiment of the inductor 114 and the pattern of interconnects 113. As will be further explained with reference to the following Figures, the inductor 114 and the pattern of interconnects 113 need not to be defined in a single metallization layer or even within the same chip. The inductor 114 in particular may be located elsewhere.

According to this embodiment, the pattern of interconnects 113 is defined with reference to a center 143. The individual interconnects 113 extend radially from this center 143. The center 143 furthermore couples all interconnects together. The center 143 is defined with reference to the inductor 114. In this manner, the interconnects extend perpendicularly to any eddy currents. The eddy currents are caused by the main current flowing through the inductor 114 around the center 143.

Length L and width W can be defined with respect to each individual interconnect 113A-H. The length direction is herein chosen parallel to the radial extending from the center. The width direction is oriented perpendicularly to the length. In a preferred embodiment, the width W of the interconnect 113A-H increases with the distance to the center 143 of the network 102. The advantage hereof is that the distance between neighboring interconnects 113A, 113B is kept constant. Another advantage is that the available surface area may be used most efficiently, as the non-interconnected area is kept as small as possible.

Figure 8:
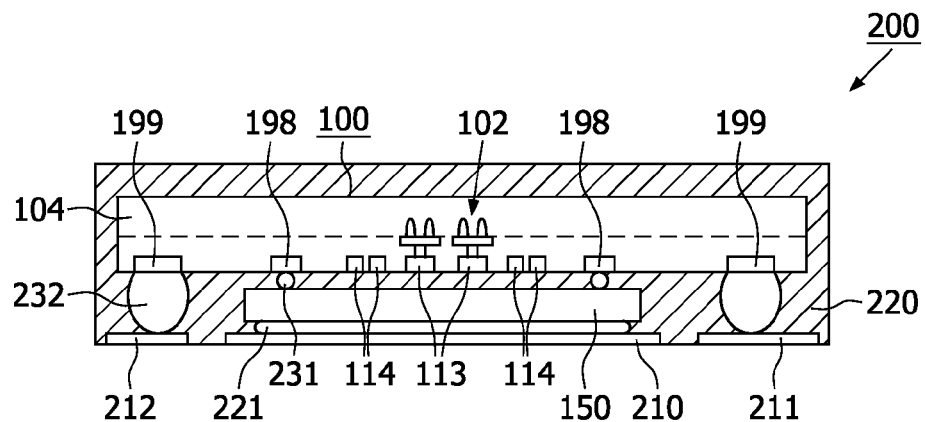
FIG. 8 shows the assembly according to a first embodiment.
Figure 9:
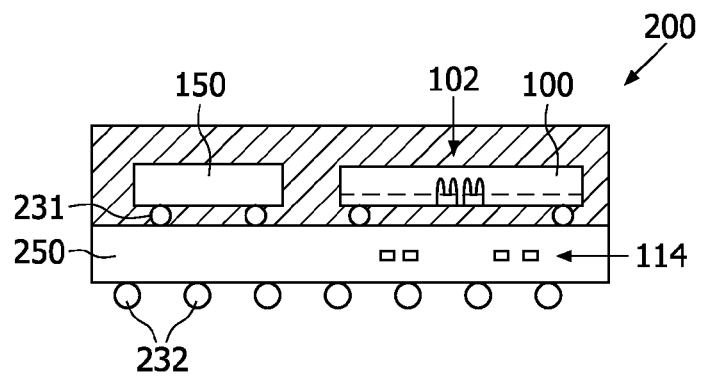
FIG. 9 shows the assembly according to a second embodiment.
Figure 10:
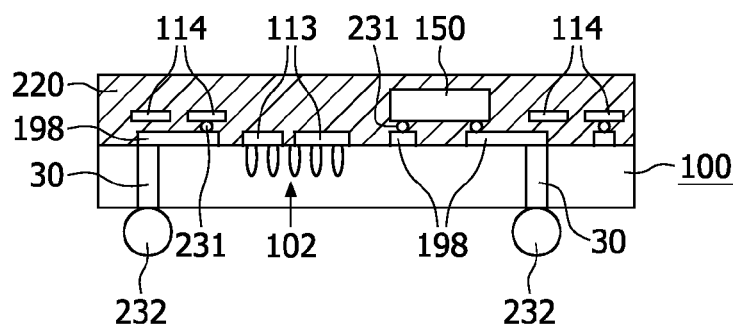
FIG. 10 shows the assembly according to a third embodiment.

FIGS. 8-10 show several embodiments of the assembly 200 of the invention. Generally, the assembly 200 comprises the second chip 100 with the network of trench capacitors 102, a first chip 150, and optionally a further assembly element such as an encapsulation, a carrier substrate. The assembly further comprises any elements needed for mutual interconnection and for interconnection to a printed circuit board, as are known per se to the skilled person in the field of assembly.

FIG. 8 shows in diagrammatical cross-sectional view an assembly 200 that comprises a leadframe with a heatsink 210 and contact pads 211, 212. The first chip 150 and the second chip 100 are assembled to the leadframe in a double flip-chip configuration: the first chip, generally an integrated circuit, is attached to the heat sink 210 with an adhesive 221. Thereafter, the second chip 100 is provided, which is attached both to the first chip 150 and to the contact pads 211, 212 with solder bumps 231, 232 of different diameter. The second chip 100 comprises in this embodiment both the network of trench capacitors 102 with the interconnects 113A, 113B, and the inductor 114. The interconnects 113 and the inductor 114 are suitably defined in the same layer that is used for the definition of the contact pads and/or the underbump metallization 198, 199. The assembly 200 is further provided with a dielectric encapsulation 220, which is an epoxy molding material in particular. Space between the first chip 150 and the second chip 100 may be filled with an underfill. A shielding is suitably implemented in the first chip 150.

FIG. 9 shows in diagrammatical cross-sectional view a second embodiment of the assembly 200. This assembly 200 comprises a carrier substrate 250 in addition to the first chip 150 and the second chip 100. Such a carrier substrate is for instance an FR-4 based multilayer substrate or alternatively a metallized polyimide tape. Such carrier substrates are known to the skilled person from the field of ball grid array packages. The present example shows a multilayer substrate with an inner metal layer wherein the inductor 114 is defined. The integration of the inductor of the DC-DC converter in the multilayer substrate is not needed, but advantageous from a cost perspective. The trench capacitors 102 are still provided with an optimized interconnect 113. Both the first chip 150 and the second chip 100 are herein assembled to the carrier substrate 250 with bumps, but wirebonds could be used alternatively, particularly for the first chip 150. This however is deemed not advantageous, as the wirebonds have an ESL that might limit the switching frequency. This is particularly the case when the switches of the DC-DC converter are defined in the first chip 150 instead of in the second chip 100.

FIG. 10 shows a third embodiment of the assembly 200 in diagrammatical cross-sectional view. The second chip 100 acts herein as the carrier substrate of the assembly, and is provided with vertical interconnects 30. The resulting assembly 200 may be of small size. The inductor 114 is in this embodiment defined within the encapsulation 220 and coupled to the second chip 100 with bumps 231. As will be understood, this embodiment of the inductor 114 could be used also in combination with the carrier substrate 250 shown in FIG. 9. The stacked die assembly of this FIG. 10 may also be combined with a carrier substrate as shown in FIG. 9.

The invention claimed is:

1. An assembly of a first chip and a second chip, which first chip comprises a semiconductor device, and which second chip comprises a substrate with a surface and a network of trench capacitors that comprise a first and a second electrode and an intermediate dielectric, the intermediate dielectric extending substantially perpendicular to the surface of the substrate within a first area, in which assembly a DC-DC converter is defined with a switching frequency in the range of 50-200 MHz and having an output filter with an inductor and with said network of trench capacitors in the second chip, which trench capacitors are coupled in parallel with a pattern of interconnects that is configured and adapted to limit generation of eddy current induced by the inductor in the interconnects.

2. An assembly as claimed in claim 1, wherein the plurality of trench capacitors are positioned such with respect to the inductor that trench capacitors in the network are located within an outer edge of the inductor on perpendicular projection of the trench capacitors and the inductor on the surface of the substrate.

3. An assembly as claimed in claim 2, wherein the pattern comprises a plurality of stripe-shaped interconnects that extend radially from a center of the plurality of stripe-shaped interconnects.

4. An assembly as claimed in claim 1, wherein the inductor is defined in the second chip.

5. An assembly as claimed in claim 1, further comprising an encapsulation wherein the inductor is defined as a metal pattern that is coupled to the second chip with bumps.

6. An assembly as claimed in claim 1, further comprising a multilayer carrier substrate to which the first and the second chip are assembled, in which carrier substrate the inductor is defined.

7. An assembly as claimed in claim 1, wherein the network of trench capacitors with any interconnects connecting the capacitors according to a desired pattern has an ESL of less than 40 pH.

8. An assembly as claimed in claim 1, wherein the inductor and the network of trench capacitors are part of a series notch circuit and are configured and adapted to create a notch at the switching frequency of the DC-DC converter.

9. An assembly as claimed in claim 8, wherein the output filter comprises a cascade of the series notch filters that are tuned to the switching frequency and to a second harmonic of the switching frequency.

10. An assembly as claimed in claim 1, further comprising a third chip that is provided with a supply voltage through said DC-DC converter or through a second integrated DC-DC converter, wherein the supply voltage of the third chip is different from a supply voltage supplied by the DC-DC converter to the first chip.

11. An assembly as claimed in claim 10, wherein the assembly has a voltage supply interface to an external board for a single supply voltage.

12. An assembly as claimed in claim 1, wherein the semiconductor device is an integrated circuit of active elements.

13. An assembly as claimed in claim 1, wherein the semiconductor device comprises a light-emitting diode.

14. A chip comprising a substrate with a main surface and a network of trench capacitors that comprise a first and a second electrode and an intermediate dielectric, the intermediate dielectric extending substantially perpendicular to the surface of the substrate within a first part of the trench capacitor, which chip comprises a first portion of a filter that comprises at least an inductor and the network of trench capacitors, and wherein the trench capacitors are coupled in parallel with a pattern of interconnects that is configured and adapted to limit generation of eddy current induced by the inductor in the interconnects, wherein the filter is an output filter of a DC-DC converter that operates with a switching frequency in the range of 50 to 200 MHz.

15. A chip comprising a substrate with a main surface and a network of trench capacitors that comprise a first and a second electrode and an intermediate dielectric, the intermediate dielectric extending substantially perpendicular to the surface of the substrate within a first part of the trench capacitor, which chip comprises a first portion of a filter that comprises at least an inductor and the network of trench capacitors, and wherein the trench capacitors are coupled in parallel with a pattern of interconnects that is configured and adapted to limit generation of eddy current induced by the inductor in the interconnects.

16. A chip as claimed in claim 15, further comprising the inductor.

17. A chip as claimed in claim 15, wherein the substrate is a semiconductor substrate in which the trench capacitors are defined in a first area of the substrate, which first area has a substrate resistivity of more than 0.5 kOhm/square.

18. A chip as claimed in claim 15, wherein the trench capacitors comprise a second dielectric and a third electrode extending parallel to the other dielectric and the other electrodes.

19. A chip as claimed in claim 15, further comprising vertical interconnects extending from the surface of the substrate to an opposite surface.

20. A method of operating an assembly as claimed in claim 1 or a chip as claimed in claim 14 by switching the DC-DC converter at a frequency in the range of 50 200 MHz.

21. A chip as claimed in claim 14, wherein the substrate has a further area in which active circuitry is defined that is part of the DC-DC converter.

22. A chip as claimed in claim 14, wherein the output filter comprises a series notch circuit and its inductor and its network of trench capacitors are configured and adapted to create a notch at the switching frequency of the converter.

23. A chip comprising a substrate with a main surface and a network of trench capacitors that comprise a first and a second electrode and an intermediate dielectric, the intermediate dielectric extending substantially perpendicular to the surface of the substrate within a first part of the trench capacitor, which chip comprises a first portion of a filter that comprises at least an inductor and the network of trench capacitors, and wherein the trench capacitors are coupled in parallel with a pattern of interconnects that is configured and adapted to limit generation of eddy current induced by the inductor in the interconnects, wherein the plurality of trench capacitors are positioned such with respect to the inductor that trench capacitors in the network are located within an outer edge of the inductor on perpendicular projection of the trench capacitors and the inductor on the surface of the substrate.

24. A chip as claimed in claim 23, wherein the pattern of interconnects comprises a plurality of stripe-shaped interconnects that extend radially from a center, which center is defined on a magnetic field line extending from a center of the inductor.

* * * * *